United States Patent
Lin et al.

(10) Patent No.: US 8,951,922 B2
(45) Date of Patent: Feb. 10, 2015

(54) METHOD FOR FABRICATING AN INTERLAYER

(71) Applicant: National Taiwan University, Taipei (TW)

(72) Inventors: Ching-Fuh Lin, Taipei (TW); Kuei-Yu Cian, Taipei (TW); Shao-Hsuan Kao, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 13/801,517

(22) Filed: Mar. 13, 2013

(65) Prior Publication Data

US 2014/0206131 A1 Jul. 24, 2014

(30) Foreign Application Priority Data

Jan. 22, 2013 (TW) .............................. 102102293 A

(51) Int. Cl.
*H01L 21/312* (2006.01)
*C08F 2/48* (2006.01)
*H01L 51/00* (2006.01)
*H01L 51/42* (2006.01)

(52) U.S. Cl.
CPC ........ *H01L 51/0003* (2013.01); *H01L 51/0035* (2013.01); *H01L 51/0047* (2013.01); *H01L 51/424* (2013.01)
USPC .......................................... 438/781; 427/508

(58) Field of Classification Search
CPC ................. H01L 21/02667; H01L 31/022466; H01L 51/0047; H01L 51/0097; H01L 51/5237
See application file for complete search history.

(56) References Cited

U.S. PATENT DOCUMENTS

| | | | | |
|---|---|---|---|---|
| 5,843,591 | A | * 12/1998 | Oishi et al. | ..................... 428/702 |
| 2002/0110695 | A1 | * 8/2002 | Yang et al. | .................... 428/447 |
| 2004/0175501 | A1 | * 9/2004 | Lukas et al. | ............. 427/255.28 |
| 2009/0142638 | A1 | * 6/2009 | Katayama | ....................... 429/30 |
| 2011/0100465 | A1 | * 5/2011 | Horng et al. | ................... 136/263 |

\* cited by examiner

*Primary Examiner* — Zandra Smith
*Assistant Examiner* — Pamela E Perkins
(74) *Attorney, Agent, or Firm* — Donald E. Stout; Stout, Uxa & Buyan, LLP

(57) ABSTRACT

The present invention relates to a method for fabricating an interlayer, and particularly relates to a method for fabricating an interlayer PCBM which is difficult to be dissolved in organic solvents. The solubility of the interlayer (PCBM) in organic solvents is decreased by polymerization of the interlayer (PCBM). Therefore, the thickness of the interlayer (PCBM) can be efficiently controlled, and the yield rate and efficiency of photoelectric devices can be improved.

25 Claims, 2 Drawing Sheets

METHOD FOR FABRICATING AN INTERLAYER

CROSS-REFERENCE TO RELATED APPLICATIONS

The entire contents of Taiwan Patent Application No. 102102293, filed on Jan. 22, 2013, from which this application claims priority, are incorporated herein by reference.

BACKGROUND OF THE INVENTION

1. Field of the Invention

The present invention relates to a method for fabricating an interlayer, and particularly relates to a method for fabricating an interlayer PCBM which is difficult to be dissolved in organic solvents.

2. Description of Related Art

In the process of manufacturing photoelectric devices (such as solar cell), donors are mixed with acceptors for increasing contact area between the donors and the acceptors. Although the contact area between the donors and the acceptors is increased by this way, the donors and the acceptors cannot be arranged in a predetermined or desired direction. This is because the distribution of the donors and the acceptors is random when the film made of the donors and the acceptors is formed. Therefore, many methods are developed to solve this problem and to make the acceptors be arranged in a predetermined or desired direction when the film made of the donors and the acceptors is formed. Addition of an interlayer PCBM is the simplest way to solve this problem.

However, there is a serious drawback in the method of addition of an interlayer PCBM. The interlayer PCBM is easy to be dissolved in an organic solvent. The mixed solution of the donors and the acceptors, which is used to coat on the interlayer PCBM, is prepared in an organic solvent, too. Therefore, when the mixed solution of the donors and the acceptors is coated on the interlayer PCBM, the interlayer PCBM will be dissolved in the mixed solution of the donors and the acceptors and removed by this mixed solution. Thus the thickness of the interlayer PCBM cannot be controlled, and the distribution of the donors and the acceptors and the quality of the film made of the donors and the acceptors cannot be efficiently controlled. Furthermore, the quality of each photoelectric device cannot be controlled because of this drawback, and it results in low yield rate.

Therefore, there is a need for a method for fabricating an interlayer PCBM which is difficult to be dissolved by organic solvents. The method can efficiently control the thickness of interlayer PCBM, and further, the method can efficiently control the distribution of the donors and the acceptors and the quality of the film made of the donors and the acceptors. Therefore, the yield rate of photoelectric devices can be improved.

SUMMARY OF THE INVENTION

In view of the foregoing, one object of the present invention is to provide a method for fabricating an interlayer. By this method, an interlayer PCBM, which is difficult to be dissolved in organic solvents, is formed and the thickness of the interlayer PCBM is efficiently controlled. This results in increasing of the contact area between the donors and the acceptors and a good distribution of the donors and the acceptors while the film made of the donors and the acceptors is formed. Therefore, the yield rate of photoelectric devices can be improved.

According to the objects above, a method for fabricating an interlayer is disclosed herein. The method comprises following steps: (1) providing a substrate; (2) forming an interlayer on the substrate; and (3) performing a polymerization to the interlayer for modifying the interlayer. By polymerization of the interlayer, the interlayer PCBM is modified to be an interlayer which is difficult to be dissolved in organic solvents. Therefore, the interlayer is not dissolved in the mixed solution of the donors and the acceptors which is coated on the interlayer, and the interlayer will not be removed. By this way, the thickness of the interlayer is efficiently controlled. Furthermore, there are some OH bondings generated on the surface of the interlayer because of the polymerization of the interlayer. In some photoelectric devices (such as solar cell), these OH bondings cause charge accumulation and the charge accumulation has a negative effect upon efficiency of photoelectric devices. Therefore, after the interlayer is polymerized, an OH bonding removing treatment can be performed to the surface of the polymerized interlayer for efficiently removing the OH bondings on the surface of the interlayer which result in polymerization of the interlayer. Furthermore, the charge accumulation caused by these OH bondings can be eliminated. Therefore, an interlayer PCBM, which has a predetermined thickness and has no charge accumulation, is formed by the method for fabricating an interlayer disclosed herein. Furthermore, the vertical distribution of the donors and the acceptors can be efficiently controlled and the yield rate of photoelectric devices can be improved.

Therefore, the present invention provides a method for fabricating an interlayer which is difficult to be dissolved in organic solvents. By this method, the thickness of the interlayer is efficiently controlled and the predetermined (or desired) vertical distribution of the donors and the acceptors can be achieved. Furthermore, the quality of the photoelectric devices can be efficiently controlled and the yield rate of photoelectric devices can be improved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The detailed description of the present invention will be discussed in the following embodiments, which are not intended to limit the scope of the present invention, and can be adapted for other applications. While drawings are illustrated in detail, it is appreciated that the quantity of the disclosed components may be greater or less than that disclosed, except where expressly restricting the amount of the components.

Figure 1A:
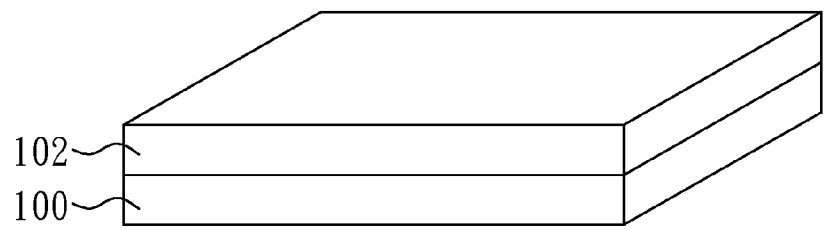
FIG. 1A to FIG. 1D are a series of 3D drawings illustrating a method for fabricating an interlayer in accordance with an embodiment of the present invention.
Figure 1B:
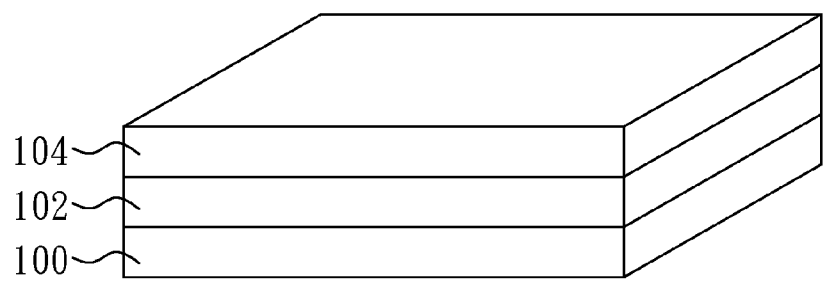

FIG. 1A to FIG. 1D show a method for fabricating an interlayer in accordance with an embodiment of the present invention, and are a series of 3D drawings illustrating the process of this method and different steps of this method. Referring to FIG. 1A, first, a substrate 100 is provided wherein the substrate 100 is an ITO substrate, a glass substrate, a silicon substrate, or a flexible plastic substrate. In this embodiment, an inorganic semiconductor structure 102 has been formed or deposed on the substrate 100 (as shown in FIG. 1A). The inorganic semiconductor structure 102 is a zinc oxide structure, a titanium oxide structure, or other metal oxide structure, and the inorganic semiconductor structure 102 is single crystal, multi-crystal, or amorphous crystal. Furthermore, the inorganic semiconductor structure 102 may be a macro/nano-island structure, macro/nano-rod structure, macro/nano-wire structure, macro/nano-tube structure, or macro/nano-porous structure.

However, in other embodiments of the present invention, the substrate provided in this step may be an inorganic semiconductor structure directly or a substrate without the inorganic semiconductor structure deposed thereon. Any composition, crystal, and structure of the inorganic semiconductor structure 102 mentioned above can be used as the composition, crystal, and structure of the inorganic semiconductor structure which is directly used as the substrate, and any substrate 100 mentioned above can be used as the substrate without the inorganic semiconductor structure deposed thereon.

After the substrate 100 is provided, the substrate 100 is cleaned and dried, for example the substrate 100 is washed by deionized water, acetone, methanol, and isopropanol respectively, and then the substrate 100 is washed by deionized water and the substrate 100 is blown to be dried by a nitrogen gun. However, this is not a limit and any method capable of cleaning the substrate 100 without damage can be adopted to clean and dry the substrate 100. Then, referring to FIG. 1B, an interlayer 104 is formed on the substrate 100 (or the inorganic semiconductor structure 102). The interlayer 104 is a PCBM film, for example PCBM film is made of C60, C70, $PC_{61}BM$, C60 derivatives, or C70 derivatives. The PCBM film is formed on the substrate 100 (or the inorganic semiconductor structure 102) by solution method and it comprises following steps: first, a PCBM, such as C60, C70, $PC_{61}BM$, C60 derivatives, or C70 derivatives, is dissolved in an organic solvent for preparing a solution wherein any organic solvent which can dissolve the PCBM and cannot react with the substrate 100 (and the inorganic semiconductor structure 102) can be used. Then the solution is coated on the substrate 100 (or the inorganic semiconductor structure 102) by spin coating, spray coating, ink printing, contact coating, dip coating, or roll-to-roll for forming a PCBM film, which is used as the interlayer 104, on the substrate 100 (or the inorganic semiconductor structure 102). The thickness of the interlayer 104 (or the PCBM film) is 1 nm to 200 nm but not limited to this. The thickness of the interlayer 104 (or the PCBM film) can be changed and modified according to the type and the design of the photoelectric device which is desired to be fabricated in following process.

Figure 1C:
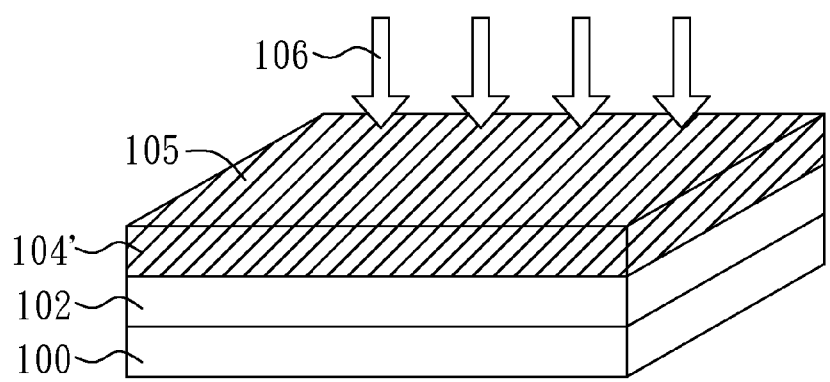

Then, referring to FIG. 1C, a polymerization 106 is performed to the interlayer 104 to polymerize the PCBM molecules in the interlayer 104 with each other. By this way, the interlayer 104 is modified for forming a PCBM film having a low solubility in organic solvents. The polymerization 106 is a UV-Ozone treatment. In this UV-Ozone treatment, the UV light with wavelength of 100 nm to 400 nm is applied to irradiate the surface of the interlayer 104 in an ozone environment for polymerization of the PCBM molecules in the interlayer 104. Therefore, a polymerized interlayer 104' having a low solubility in organic solvents is formed. In this UV-Ozone treatment, the UV light irradiates the surface of the interlayer 104 for 5 seconds to 2 hours. The UV-Ozone treatment is performed by a UV-Ozone cleaning apparatus but not limited to this. Any apparatus, which can emit a UV light and provide an ozone environment, can be used in this UV-Ozone treatment. Since the polymerized interlayer 104' is difficult to be dissolved in organic solvents, fabricating of a photoelectric device with the polymerized interlayer 104' can prevent the interlayer from being removed by organic solvents when the mixed solution of the donors and the acceptors is coated on the interlayer to form an active layer. Therefore, the thickness of the polymerized interlayer 104' can be efficiently controlled.

However, in this embodiment, the UV-Ozone treatment is performed to polymerize the interlayer 104 for forming the polymerized interlayer 104', but in other embodiment, the UV light with wavelength of 100 nm to 400 nm is applied to irradiate the surface of the interlayer 104 in other environments, such as an atmospheric environment or a nitrogen environment, for 5 seconds to 2 hours for forming the polymerized interlayer 104'.

The interface of the polymerized interlayer 104' is easy to be ionized to release $H^+$ ions and $O^-$ ions because there are many OH bondings on the surface of the polymerized interlayer 104'. The $H^+$ ions with positive charge will trap electrons. Therefore, except the $O^-$ ions with negative charge accumulates on the interface (or the surface of the polymerized interlayer 104'), more and more electrons trapped by the $H^+$ ions accumulates on the interface (or the surface of the polymerized interlayer 104') with injection of electrons. This results in increasing electronegativity of the interface (or the surface of the polymerized interlayer 104') and then it is more difficult for rejection of following electrons. Therefore, charge accumulation is created and the efficiency of photoelectric devices is decreased by the charge accumulation. Particularly, efficiency of some photoelectric devices, such as solar cell, is significantly decreased by the charge accumulation. Therefore, for these photoelectric devices, there is a need to remove the OH bondings on the surface of the polymerized interlayer 104' for preventing charge accumulation.

Figure 1D:
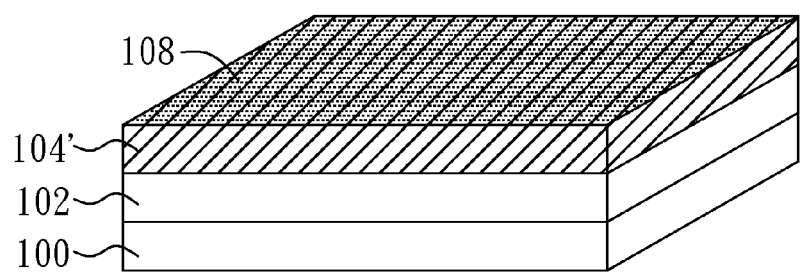

Accordingly, after the polymerized interlayer 104' is formed (or after the interlayer 104 is polymerized), referring to FIG. 1D, an OH bonding removing treatment is performed to the surface 105 of the polymerized interlayer 104' for removing the OH bondings on the surface 105 of the polymerized interlayer 104'. In this step (as shown in FIG. 1D), the OH bondings 104' is removed by coating a surfactant 108 on the surface 105 of the polymerized interlayer 104' and it comprises following steps: first, a surfactant having a molecular structure with a hydrophilic end (or group) and a hydrophobic end (or group), such as Triton X-100, in a solvent, such as water, ethyl isopropanol, toluene, xylene, or chlorine-containing solution, for preparing a surfactant solution. Then, the surfactant solution is coated on the surface 105 of the polymerized interlayer 104' by spin coating, spray coating, ink printing, contact coating, dip coating, or roll-to-roll. Many of the OH bondings on the surface 105 of the polymerized interlayer 104' are broken by the surfactant solution, and even all of the OH bondings on the surface 105 of the polymerized interlayer 104' are broken by the surfactant solution. Therefore, it can prevent the charge accumulation on the surface 105 of the polymerized interlayer 104' caused by the OH bondings. Furthermore, it can prevent decreasing of efficiency of the photoelectric devices (such as solar cell).

Although in this embodiment, the OH bondings on the surface 105 of the polymerized interlayer 104' are removed by coating a surfactant solution on the surface 105 of the polymerized interlayer 104', but in other embodiments, the OH bonding removing treatment can be performed by directly heating the polymerized interlayer 104' at 300° C. to 600° C. for 1 minute to 1 hour for removing the OH bondings on the surface 105 of the polymerized interlayer 104'. This method also can remove the OH bondings on the surface 105 of the polymerized interlayer 104', but it is not suitable for the process that uses the substrate, the inorganic semiconductor structure, and the interlayer made of temperature sensitive materials or non-heating-resistant materials because it has a need to be heated to at least 300° C. in this method. However, any one of the OH bonding removing treatments above mentioned can be used to remove the OH bondings according to the design of the process.

According to foregoing embodiments (the steps shown in FIG. 1A to FIG. 1D), the present invention provides a method for fabricating an interlayer PCBM having low solubility in organic solvents. The interlayer fabricated by this method is difficult to be dissolved in organic solvents because the interlayer has been polymerized. Thus the thickness of the interlayer can be efficiently controlled when the mixed solution of the donors and the acceptors is coated on the interlayer for following process of fabricating a photoelectric device. Therefore, not only the contact area between the donors and the acceptors can be efficiently increased but the predetermined (or desired) vertical distribution of the donors and the acceptors also can be achieved for controlling the quality of photoelectric devices. Besides, it can prevent the polymerized interlayer from the charge accumulation on the surface of the polymerized interlayer by the OH bonding removing treatment in this method. Accordingly, the polymerized interlayer still has a good electron transport efficiency and a good hole transport efficiency. Therefore, the efficiency of the photoelectric devices fabricated by this interlayer can be decreased and even it can be improved.

A photoelectric device with PBDTT-DPP/$PC_{71}BM$ system is taken for example in following description. If a planar zinc oxide structure of the device has an interlayer $PC_{71}BM$ fabricated by the method of the present invention, the Voc of the device is increases from 0.72 V to 0.76 V, the Jsc is increased from 8 mA/cm$^2$ to 9 mA/cm$^2$, and the efficiency of the device is increased from 2.8% to 3.8%. If a zinc oxide nano-rod structure of the device has an interlayer $PC_{71}BM$ fabricated by the method of the present invention, the Voc of the device is increased from 0.67 V to 0.72 V, the Jsc is increased from 12.52 mA/cm$^2$ to 17.19 mA/cm$^2$, and the efficiency of the device is increased from 3.5% to 6.4%. According to above-mentioned examples, it is recognized that the efficiency of the photoelectric devices can be efficiently increased or improved by using the interlayer (PCMB) to fabricate the photoelectric devices, and particularly the efficiency of the photoelectric devices having non-planar zinc oxide structure can be more efficiently increased or improved by using the interlayer (PCMB) to fabricate the photoelectric devices.

Besides, all steps of the method for fabricating an interlayer of the present invention, no matter the steps of forming an interlayer, polymerizing the interlayer, and performing an OH bonding removing treatment to the polymerized interlayer, are performed by coating and UV light irradiation respectively. Coating and UV light irradiation are the methods and processes which have advantages of simple process and low cost and are not critical to temperature (for example performing at room temperature). Therefore, the method for fabricating an interlayer of the present invention is simple and inexpensive.

Furthermore, the present invention further provides a method for fabricating a photoelectric device with an interlayer which is fabricated by the method for fabricating an interlayer of the present invention. The method for fabricating a photoelectric device comprises following steps: first, a polymerized interlayer 104' with the surfactant 108 coated on the surface thereof is formed by foregoing steps (the steps shown in FIG. 1A to FIG. 1D or in other embodiments mentioned above). These steps are disclosed and detailed above so they are detailed herein again. Then, referring to FIG. 1E, an organic semiconductor structure 110 is formed on the polymerized interlayer 104' to be an active layer. In the embodiment shown in FIG. 1E, the organic semiconductor structure 110 is an organic polymer structure which is deposed on the polymerized interlayer 104' and can absorb light to generate an excitonic interaction. In other embodiments of the present invention, the organic semiconductor structure 110 is a mixed structure of an organic polymer and the polymerized interlayer wherein the organic polymer can absorb light to generate an excitonic interaction. The excitons generated by the organic polymer (structure) are separated into electrons and holes in the interface between the organic polymer (structure) and the interlayer (PCBM). Therefore, they are able to transport electrons. The methods for fabricating an organic polymer structure (or an active layer), which are used in common process of fabricating the photoelectric devices, can be applied to form the organic semiconductor structure in the present invention according to requirement of process and the desired designs and the desired types of the photoelectric devices. These methods are well known and are not the key points of the present invention so they are not detailed herein.

Figure 1E:
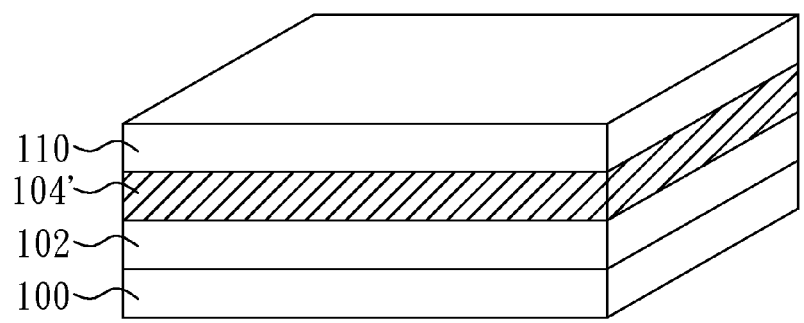
FIG. 1E to FIG. 1F are a series of 3D drawings illustrating a method for fabricating a photoelectric device in accordance with an embodiment of the present invention wherein the interlayer in the photoelectric device is fabricated by the method illustrated in FIG. 1A to FIG. 1D and thereby the method for fabricating a photoelectric device comprises the steps illustrated in FIG. 1A to FIG. 1D.
Figure 1F:
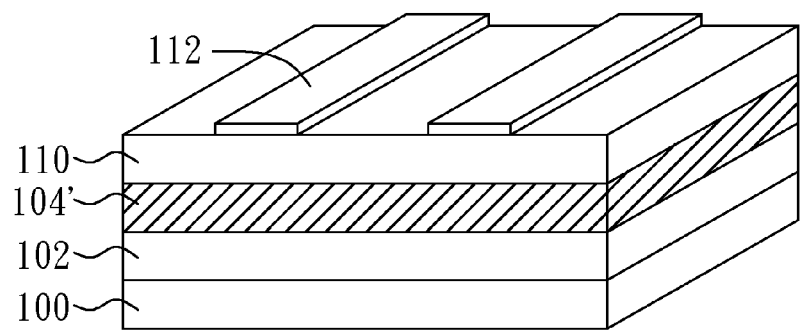

Then, referring to FIG. 1F, one or several electrodes 112 are formed on the organic semiconductor structure 110 for forming a photoelectric device. The electrode 112 is made of a metal, for example silver, aluminum, or other metal which can transport electrons well. The methods for fabricating an electrode, which are used in common process of fabricating the photoelectric devices, can be applied to form the electrode in the present invention according to requirement of process and the desired designs and the desired types of the photoelectric devices. These methods are well known and are not the key points of the present invention so they are not detailed herein.

Although in above-mentioned embodiments the organic semiconductor structure 110 is formed on the polymerized interlayer 104' after the surfactant 108 is coated on the polymerized interlayer 104', in other embodiments of the present invention the step shown in FIG. 1D is combined with the step shown in FIG. 1E. Therefore, the step of performing the OH bonding removing treatment to the surface of the polymerized interlayer 104' (or the step of coating the surfactant on the surface of the polymerized interlayer 104') and the step of forming the organic semiconductor structure 110 (or the active layer) on the polymerized interlayer 104' can be performed simultaneously. It comprises following steps: in the step of dissolving a surfactant in a solvent for preparing a surfactant solution, an organic semiconductor solvent is used to dissolve the surfactant for preparing the surfactant solution. Then, the surfactant solution is coated on the surface 105 of the polymerized interlayer 104'. Therefore, the OH bondings on the surface 105 of the polymerized interlayer 104' are removed and the organic semiconductor structure 110 (or the active layer) is formed on the polymerized interlayer 104' at the same time. Accordingly, the thickness of the interlayer can be efficiently controlled by the method for fabricating a photoelectric device provided by this invention. Furthermore, the efficiency and the yield rate of the photoelectric devices can be improved by the method for fabricating a photoelectric device provided by this invention.

Accordingly, a method for fabricating an interlayer is provided in this invention. By this method, an interlayer PCBM, which is difficult to be dissolved in an organic solvent, is formed and the thickness of the interlayer PCBM can be efficiently controlled. Therefore, the contact between the donors and the acceptors can be increased, and the good distribution of the donors and the acceptors can be achieved. Furthermore, the yield rate of the photoelectric devices can be improved or increased. Besides, a method for fabricating a photoelectric device is further provided in this invention. In this method, an interlayer (PCBM) having low solubility in an organic solvent is formed by the method for fabricating an interlayer of this invention for efficiently controlling the thickness of the interlayer (PCBM). The efficiency and the yield rate of the photoelectric devices can be improved and increased by controlling the thickness of the interlayer (PCBM).

Although specific embodiments have been illustrated and described, it will be appreciated by those skilled in the art that various modifications may be made without departing from the scope of the present invention, which is intended to be limited solely by the appended claims.

What is claimed is:

1. A method for fabricating an interlayer, comprising:
   (1) providing a substrate;
   (2) forming an interlayer on said substrate; and
   (3) performing a polymerization to said interlayer for modifying said interlayer wherein a UV light having a wavelength in range of 100 nm to 400 nm is applied to irradiate a surface of said interlayer in an ozone environment for polymerizing said interlayer; and
   (4) performing an OH bonding removing treatment to said surface of said interlayer for removing OH bondings on said surface of said polymerized interlayer after said step (3) wherein said step (4) comprises:
      dissolving a surfactant in a solvent for preparing a surfactant solution; and
      coating said surfactant solution on said surface of said interlayer.

2. The method of claim 1, wherein said substrate is an ITO substrate, a glass substrate, a silicon substrate, a flexible plastic substrate, or an inorganic semiconductor structure.

3. The method of claim 1, wherein there is an inorganic semiconductor structure deposed on said substrate.

4. The method of claim 3, wherein said inorganic semiconductor structure is a zinc oxide structure or a titanium oxide structure.

5. The method of claim 3, wherein said inorganic semiconductor structure is single crystal, multi-crystal, or amorphous crystal.

6. The method of claim 3, wherein said inorganic semiconductor structure is a macro/nano-island structure, macro/nano-rod structure, macro/nano-wire structure, macro/nano-tube structure, or macro/nano-porous structure.

7. The method of claim 3, wherein in said step (2), said interlayer is formed on said inorganic semiconductor structure.

8. The method of claim 1, wherein said interlayer is a PCBM film.

9. The method of claim 8, wherein said PCBM film is made of C60, C70, $PC_{61}BM$, C60 derivatives, or C70 derivatives.

10. The method of claim 8, wherein said thickness of said PCBM film is 1 nm to 200 nm.

11. The method of claim 1, wherein said step (2) comprises:
    dissolving a PCBM in an organic solvent for preparing a solution; and
    coating said solution on said substrate.

12. The method of claim 11, wherein said step of coating said solution on said substrate is performed by spin coating, spray coating, ink printing, contact coating, dip coating, or roll-to-roll.

13. The method of claim 1, wherein in said step (3), said UV light irradiates surface of said interlayer for 5 seconds to 2 hours.

14. The method of claim 1, wherein said surfactant has a molecular structure with a hydrophilic end and a hydrophobic end.

15. The method of claim 14, wherein said surfactant is Triton X-100.

16. The method of claim 1, wherein said solvent is water, ethyl isopropanol, toluene, xylene, or chlorine-containing solution.

17. The method of claim 1, wherein said step of coating said surfactant solution on said surface of said interlayer is performed by spin coating, spray coating, ink printing, contact coating, dip coating, or roll-to-roll.

18. The method of claim 1, wherein said solvent is a organic semiconductor solvent.

19. The method of claim 18, wherein said organic semiconductor solvent is used to coat said interlayer for forming an active layer on said interlayer, and thereby said active layer is formed on said interlayer and the OH bonding removing treatment is performed to said interlayer simultaneously.

20. The method of claim 1, further comprising a step of forming an organic semiconductor structure for forming an organic semiconductor structure on said interlayer.

21. The method of claim 20, wherein said organic semiconductor structure is a mixed structure of an organic polymer and said interlayer, or an organic polymer structure.

22. The method of claim 21, wherein said organic polymer is an organic polymer which can absorb light to generate an excitonic interaction, and said organic polymer structure is an organic polymer structure which can absorb light to generate an excitonic interaction.

23. The method of claim 20, further comprising a step of forming an electrode for forming one or several electrodes on said organic semiconductor structure.

24. The method of claim 20, wherein said electrode is made of a metal.

25. The method of claim 24, wherein said metal is sliver or aluminum.

* * * * *